US012628447B2

(12) United States Patent
Saxod et al.

(10) Patent No.: US 12,628,447 B2
(45) Date of Patent: May 12, 2026

(54) IMAGE SENSOR HAVING LOW PARASITIC LIGHT SENSITIVITY

(71) Applicant: Commissariat à l'Énergie Atomique et aux Énergies Alternatives, Paris (FR)

(72) Inventors: Olivier Saxod, Grenoble (FR); François Ayel, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 1186 days.

(21) Appl. No.: 17/463,627

(22) Filed: Sep. 1, 2021

(65) Prior Publication Data

US 2022/0077208 A1 Mar. 10, 2022

(30) Foreign Application Priority Data

Sep. 4, 2020 (FR) ...................................... 2008983

(51) Int. Cl.
*H10F 39/00* (2025.01)
*G01S 17/08* (2006.01)
*G01S 17/89* (2020.01)

(52) U.S. Cl.
CPC ........ *H10F 39/80373* (2025.01); *G01S 17/08* (2013.01); *G01S 17/89* (2013.01)

(58) Field of Classification Search
CPC ... H10F 39/80373; H10F 39/807; G01S 17/08
See application file for complete search history.

(56) References Cited

U.S. PATENT DOCUMENTS

| | | | |
|---|---|---|---|
| 10,741,593 B1 | 8/2020 | Mabuchi et al. | |
| 2008/0099807 A1* | 5/2008 | Kim ...................... | H10F 39/802 |
| | | | 257/292 |
| 2017/0134683 A1* | 5/2017 | Guyader ............. | H10F 39/8067 |
| 2017/0366764 A1* | 12/2017 | Innocent ............... | H04N 25/77 |
| 2017/0373108 A1* | 12/2017 | Hwangbo ............. | H10F 39/199 |
| 2018/0068424 A1* | 3/2018 | Kwon ................... | G01S 7/4915 |
| 2018/0167606 A1 | 6/2018 | Cazaux et al. | |
| 2018/0315784 A1* | 11/2018 | Saxod ................... | H10F 39/014 |
| 2019/0086519 A1 | 3/2019 | Roy et al. | |
| 2019/0237499 A1 | 8/2019 | Roy | |
| 2020/0168646 A1 | 5/2020 | Suler et al. | |

OTHER PUBLICATIONS

Preliminary Search Report for French Application No. 2008983, dated May 3, 2021.

* cited by examiner

*Primary Examiner* — William B Partridge
*Assistant Examiner* — Felix B Andrews
(74) *Attorney, Agent, or Firm* — Wolf, Greenfield & Sacks, P.C.

(57) ABSTRACT

An image sensor comprising a plurality of pixels formed inside and on top of a semiconductor substrate, each pixel comprising: a photosensitive area formed in the semiconductor substrate; a storage area formed in the semiconductor substrate; and a first transistor of transfer between the photosensitive area and the storage area, wherein the first transfer transistor comprises a gate vertically extending in the semiconductor substrate, from a top surface of the semiconductor substrate, inside of an insulating trench delimiting the storage area.

9 Claims, 7 Drawing Sheets

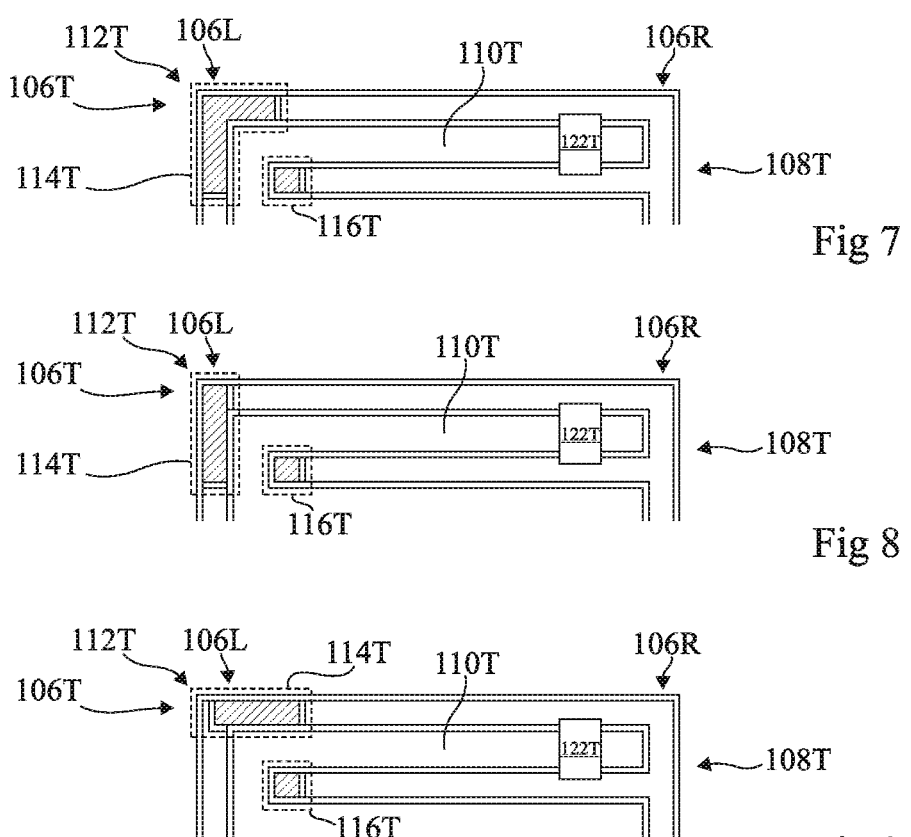
Fig 7
Fig 8
Fig 9
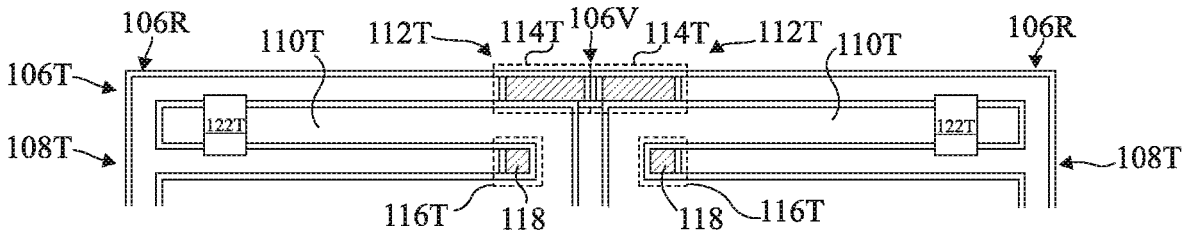
Fig 10
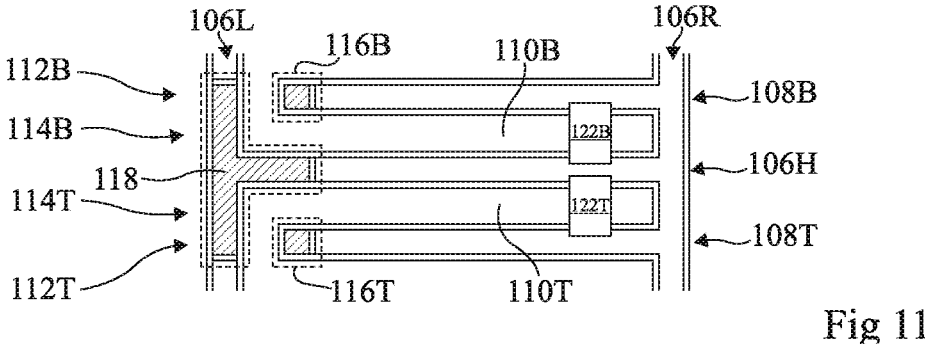
Fig 11

IMAGE SENSOR HAVING LOW PARASITIC LIGHT SENSITIVITY

CROSS REFERENCE TO RELATED APPLICATION(S)

This application is a translation of and claims the priority benefit of French patent application number 20/08983, filed on Sep. 4, 2020, entitled "Capteur d'images" which is hereby incorporated by reference to the maximum extent allowable by law.

TECHNICAL BACKGROUND

The present disclosure generally concerns electronic devices and, more specifically, image sensors.

PRIOR ART

Images sensors, for example, of the type described in patent application US2019086519, having their pixels comprising a photosensitive area, or detection area, separate from at least one storage area by a transfer transistor, are known.

SUMMARY

There is a need to improve existing image sensors. It would in particular be desirable to obtain image sensors having a low parasitic light sensitivity (PLS).

An embodiment overcomes all or part of the disadvantages of known image sensors.

An embodiment provides an image sensor comprising a plurality of pixels formed inside and on top of a semiconductor substrate, each pixel comprising:
- a photosensitive area formed in the semiconductor substrate;
- a storage area formed in the semiconductor substrate; and
- a first transistor of transfer between the photosensitive area and the storage area, wherein the first transfer transistor comprises a gate vertically extending in the semiconductor substrate, from a top surface of the semiconductor substrate, inside of an insulating trench delimiting the storage area.

According to an embodiment, the insulating trench is a capacitive insulating trench comprising a metal region electrically insulated from the semiconductor substrate.

According to an embodiment, the gate of the first transfer transistor of each pixel is electrically insulated from the semiconductor substrate and from the metal region.

According to an embodiment:
- the metal region is intended to be taken to a fixed potential; and
- the gate is intended to be taken to a variable potential, having a first level controlling the setting to the on state of the first transfer transistor and a second level controlling the setting to the off state of the first transfer transistor.

According to an embodiment, the gate is made of a metal or of a metal alloy.

According to an embodiment, the gate is made of polysilicon.

According to an embodiment, the sensor is configured to estimate distances by time of flight.

According to an embodiment, the storage area is separated from the first transfer transistor by a second transfer transistor.

According to an embodiment, the second transfer transistor comprises a gate vertically extending in the semiconductor substrate, from the top surface of the semiconductor substrate, inside of the insulating trench delimiting the storage area.

An embodiment provides a method of controlling a sensor such as described, the method comprising, for each pixel, the steps of:
- a) setting the second transfer transistor to the on state;
- b) setting the first transfer transistor to the on state;
- c) after steps a) and b), setting the first transfer transistor to the off state; and
- d) after step c), setting the second transfer transistor to the off state.

According to an embodiment, steps a) and b) are carried out simultaneously.

BRIEF DESCRIPTION OF THE DRAWINGS

The foregoing and other features and advantages of the present invention will be discussed in detail in the following non-limiting description of specific embodiments and implementation modes in connection with the accompanying drawings, in which:

FIG. 7 is a partial simplified top view of another variant of the pixel of FIG. 1;

FIG. 8 is a partial simplified top view of still another variant of the pixel of FIG. 1;

FIG. 9 is a partial simplified top view of still another variant of the pixel of FIG. 1;

FIG. 10 is a partial simplified top view of two pixels of the type of that discussed in relation with FIG. 9;

FIG. 11 is a partial simplified top view of two pixels of the type of that discussed in relation with FIG. 7;

DESCRIPTION OF THE EMBODIMENTS

Figures 1, 2, 3:
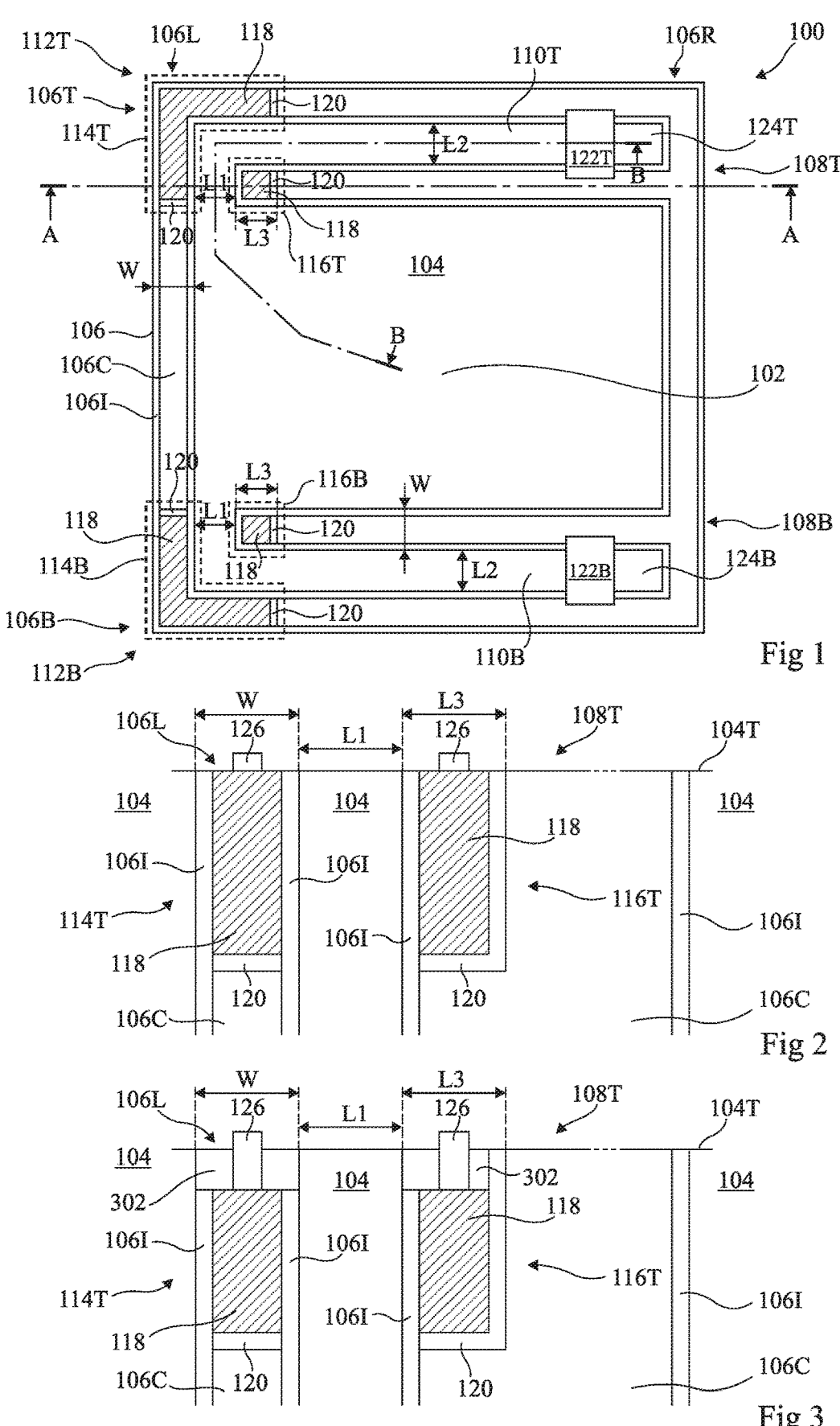
FIG. 1 is a partial simplified top view of an image sensor pixel according to a first embodiment.
FIG. 2 is a partial simplified cross-section view of the pixel of FIG. 1 along plane AA of FIG. 1.
FIG. 3 is a partial simplified cross-section view of a variant of the pixel of FIG. 1 along plane AA of FIG. 1.

Like features have been designated by like references in the various figures. In particular, the structural and/or functional elements common to the different embodiments and implementation modes may be designated with the same reference numerals and may have identical structural, dimensional, and material properties.

For clarity, only those steps and elements which are useful to the understanding of the described embodiments and implementation modes have been shown and will be detailed. In particular, the pixel control and readout circuits will not be detailed, the described embodiments and implementation modes being compatible with usual control and readout circuits, or the forming of these circuits being within the abilities of those skilled in the art based on the indications of the present description.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings.

Unless specified otherwise, the expressions "around", "approximately", "substantially" and "in the order of" signify within 10%, and preferably within 5%.

In the present description, parasitic light sensitivity, or PLS, designates a characteristic of an image sensor typically linked to an absorption of parasitic light in memory areas or storage areas of pixels of the sensor (optical PLS) or to an untimely transfer, to these memory or storage areas, of carriers generated in a photoconversion area of the sensor pixels (electrical PLS). In the case of a high sensitivity to parasitic light, the sensor pixels generally have a low signal-to-noise ratio.

FIG. 1 is a partial simplified top view of an example of a pixel 100 of an image sensor according to a first embodiment. FIG. 2 is a partial simplified cross-section view of the pixel 100 along plane AA of FIG. 1.

In the shown example, pixel 100 comprises a photosensitive area 102. Photosensitive area 102 is for example intended to collect photons during phases of illumination of the image sensor comprising pixel 100, and to convert these photons into electron-hole pairs. In top view, photosensitive area 102 is located at the center of pixel 100 and has a substantially rectangular shape.

Photosensitive area 102 is for example formed in a substrate 104. As an example, substrate 104 is a wafer or a piece of wafer made of a doped semiconductor material of a first conductivity type, for example, of N-type doped silicon. Substrate 104 for example has, at the location where photosensitive area 102 is formed, a doping rate in the range from $1\times10^{14}$ at./cm³ to $1\times10^{16}$ at./cm³.

Substrate 104 may further comprise, at its surface, a doped region of a second conductivity type, that is, type P in this example. In this case, substrate 104 for example has a surface doping in the range from $1\times10^{18}$ at./cm³ to $1\times10^{20}$ at./cm³. The doped region of substrate 104 of the second conductivity type is for example taken to a reference potential $V_{REF}$.

In the shown example, pixel 100 further comprises a peripheral insulating trench 106, for example, a capacitive insulating trench. Peripheral insulating trench 106 for example enables to electrically insulate the photosensitive area 102 of pixel 100 from the photosensitive areas of the neighboring pixels, not shown in FIG. 1. Peripheral insulating trench 106 is for example formed in semiconductor substrate 104. As illustrated in FIG. 2, peripheral insulating trench 106 for example extends vertically across the thickness of substrate 104 from a top surface 104T of substrate 104.

Peripheral insulating trench 106 for example has a width W in the range from 50 nm to 400 nm. As an example, peripheral insulating trench 106 has a depth in the range from 1 μm to 20 μm.

In top view, peripheral insulating trench 106 surrounds photosensitive area 102. Peripheral insulating trench 106 for example has, in top view, a substantially rectangular or square circumference. In the orientation of FIG. 1, peripheral insulating trench 106 more particularly comprises a top horizontal portion 106T, a bottom horizontal portion 106B, a left-hand vertical portion 106L, and a right-hand vertical portion 106R. In the shown example, portions 106T, 106B, 106L, and 106R each correspond to one of the four sides of the rectangle or of the square formed by peripheral insulating trench 106. The left-hand and right-hand vertical portions 106L and 106R of peripheral insulating trench 106 longitudinally delimit photosensitive area 102.

In the shown example, peripheral insulating trench 106 further comprises two other horizontal portions 108T and 108B. As illustrated in FIG. 1, portions 108T and 108B are interposed between top and bottom horizontal portions 106T and 106B. In the shown example, portions 108T and 108B extend horizontally in substrate 104, from the right-hand vertical portion 106R of trench 106, towards the left-hand vertical portion 106L of trench 106. Portions 108T and 108B are for example parallel to each other and parallel to the horizontal portions 106T and 106B of trench 106.

In the shown example, portions 108T and 108B extend vertically across the thickness of substrate 104 from its top surface 104T. Portions 108T and 108B for example have a depth similar to that of portions 106T, 106B, 106L, and 106R. In the shown example, the portions 108T and 108B of trench 106 transversally delimit photosensitive area 102.

In top view, the ends of portions 108T and 108B located opposite portion 106L are for example each separated from portion 106L by a distance L1. As an example, distance L1 is in the range from 50 nm to 400 nm, for example, in the order of 260 nm. Portion 108T is for example separated from portion 106T by a distance L2. As an example, distance L2 is in the range from 50 nm to 400 nm. Portion 108B is for example separated from portion 106B by distance L2.

In the shown example, peripheral insulating trench 106 comprises an electrically-conductive region 106C. As an example, electrically-conductive region 106C is made of polysilicon, of a metal, for example, copper, or of a metal alloy.

In the shown example, peripheral insulating trench 106 further comprises an electrically-insulating layer 1061 coating the lateral walls and the bottom surface of electrically-conductive region 106C, and electrically insulating region 106C from substrate 104. As an example, electrically-insulating layer 1061 is made of a dielectric material, for example, of silicon oxide.

In the shown example, electrically-conductive region 106C and electrically-insulating layer 1061 are common to the portions 106T, 106B, 106L, 106R, 108T, and 108B of peripheral insulating trench 106.

The electrically-conductive region 106C of trench 106 may be biased. In the case where substrate 104 is of type N, region 106C is for example taken to a fixed potential VO, for example, equal to approximately 3.5 V. This tends to cause an accumulation of holes along the lateral walls of trench 106. This accumulation of holes particularly enables to avoid for holes photogenerated in area 102 to be trapped at the interface between substrate 104 and trench 106.

In the shown example, pixel 100 further comprises a first charge storage area or memory area 110T and a second charge storage area or memory area 110B. The first charge storage area 110T is interposed between the portions 106T and 108T of peripheral insulating trench 106, while the second storage area 110B is interposed between the portions 106B and 108B of peripheral insulating trench 106.

The storage areas 110T and 110B of pixel 100 are for example doped portions of substrate 104 of the first conductivity type. As an example, storage areas 110T and 110B have a doping rate in the range from $1 \times 10^{16}$ at./cm$^3$ to $1 \times 10^{19}$ at./cm$^3$.

In the shown example, pixel 100 further comprises first transfer transistors (that may also be called first transfer gates) 112T and 112B. The first transfer transistors 112T and 112B of pixel 100 particularly enable to control lateral charge transfers from photosensitive area 102 to storage areas 110T and 110B. Similarly, transfer transistor 112B comprises a portion 114T, formed at the angle of peripheral insulating trench 106 where portions 106L and 106T intersect, and another portion 116T, formed at the end of portion 108T located opposite portion 106L. Similarly, transfer transistor 112B comprises a portion 114B, formed at the angle of peripheral insulating trench 106 where portions 106L and 106B intersect, and another portion 116B, formed at the end of portion 108B located opposite portion 106L.

Portions 116T and 116B respectively further extend along portions 108T and 108B over a distance L3. As an example, distance L3 is substantially equal to the width W of peripheral insulating trench 106.

In the orientation of FIG. 1, the portion 114T of transfer transistor 112T extends vertically, inside of portion 106L, from the top left angle of trench 106 to the level of the bottom horizontal edge of portion 108T. Further, the portion 114T of transfer transistor 112T extends horizontally, inside of portion 106T, from the top left angle of trench 106 to a position vertically in line with the right-hand vertical edge of portion 116T of transfer transistor 112T.

Similarly, the portion 114B of transfer transistor 112B extends vertically, inside of portion 106L, from the bottom left angle of trench 106 to the level of the top horizontal edge of portion 108B. Further, the portion 114B of transfer transistor 112B extends horizontally, inside of portion 106B, from the bottom left angle of trench 106 to a position vertically in line with the right-hand vertical edge of the portion 116B of transfer transistor 112B.

As an example, transfer transistors 112T and 112B are respectively separated from storage areas 110T and 110B by a distance in the range from 50 nm to 300 nm. The portions 114T and 116T of transfer transistor 112T and the portions 114B and 116B of transfer transistor 112B are each separated by a substrate portion 104, called transfer region or channel of transistor 112T, respectively 112B, for example having an N-type doping rate in the range from $1 \times 10^{16}$ at./cm$^3$ to $1 \times 10^{19}$ at./cm$^3$.

In the shown example, the portions 114T and 116T of transfer transistor 112T and the portions 114B and 116B of transfer transistor 112B each comprise a region 118 formed in peripheral insulating trench 106. Region 118 extends vertically across the thickness of peripheral insulating trench 106 from the top surface 104T of substrate 104. Region 118 forms a gate of each transfer transistor 112T, 112B. In cross-section view, region 118 for example has a height in the range from 0.2 μm to 1.5 μm. As an example, region 118 is made of a metal or of a metal alloy, for example, of copper. As a variant, region 118 is made of doped polysilicon.

In the shown example, region 18 is electrically insulated from the conductive region 106C of peripheral insulating trench 106 and from substrate 104. More precisely, the sides of region 118 are for example bordered with insulating layer 1061 of peripheral insulating trench 106 and with an electrically-insulating layer 120. In the shown example, layer 120 further coats the bottom surface of region 118. As an example, electrically-insulating layer 120 is made of a dielectric material, for example, of silicon oxide.

The regions 118 of each portion of a same transfer transistor 112T, 112B are for example equivalent to plates of a metal-oxide-semiconductor capacitor, or MOS capacitor.

In the shown example, pixel 100 further comprises second transfer transistors (that may also be called second transfer gates) 122T and 122B. Transfer transistors 122T and 122B each comprise a planar conductive gate formed on the top surface 104T of substrate 104 and insulated from substrate 104 by a dielectric layer. In the shown example, second transfer transistor 122T separates the first storage area 110T from a first readout node 124T. Similarly, second transfer transistor 122B separates the second storage area 110B from a second readout node 124B. The transfer transistors 122T, 122B of pixel 100 respectively enable to control charge transfers from storage areas 110T, 110B to readout nodes 124T, 124B.

As an example, readout nodes 124T and 124B have a doping rate greater than that of storage areas 110T and 110B.

The areas of substrate 104 which do not form part of photosensitive area 102 may be coated with a shield layer, not shown, made of an opaque material, for example, a metal. More precisely, the first transfer transistors 112T, 112B, the storage areas 110T and 110B, the second transfer transistors 112T and 122B, and the readout nodes 124T and 124B, may be coated with the shield layer. An unwanted charge photogeneration outside of photosensitive area 102 is thus limited.

As illustrated in FIG. 2, electrodes 126 may be formed at the surface of each electrically-conductive region 118. Electrodes 126 for example enable to bias the electrically-conductive regions 118 independently from electrically-conductive region 106C. Further, electrodes 126 enable to control the biasing of the gate of transfer transistor 112T independently from that of the gate of transfer transistor 112B.

Electrodes 126 particularly enable to control an on or off state of each transfer transistor 112T, 112B. Electrodes 126 for example enable to apply to the gate of each transfer transistor 112T, 112B a variable potential, having a first level $V_{ON}$ controlling a switching to the on state of transfer transistor 112T, 112B, and having a second level $V_{OFF}$ controlling a switching to the off state of transfer transistor 112T, 112B. Potentials $V_{ON}$ and $V_{OFF}$ are defined with respect to the doping level of substrate 104 and with respect to the reference potential $V_{REF}$ applied in the surface region of substrate 104 doped with the second conductivity type.

When the electrodes 126 of transfer transistor 112T, 112B are taken to potential $V_{OFF}$, this enables to create a potential barrier in the transfer region, that is, in the portion of substrate 104 located between the two vertical gate portions of this transfer transistor. The potential barrier, which extends vertically across the thickness of substrate 104, then tends to prevent the collection by storage area 110T, 110B of the carriers photogenerated in photosensitive area 102.

However, when the electrodes 126 of transfer transistor 112T, 112B are taken to potential $V_{ON}$, this enables to lower the potential barrier created in the transfer region. The carriers photogenerated in photosensitive area 102 can then be transferred from photosensitive area 102 to be collected by storage area 110T, 110B.

In the shown example, the transfer of the carriers photogenerated in substrate 104 via vertical transfer transistors 112T, respectively 112B, is a mainly horizontal transfer. In other words, the transfer of the carriers photogenerated in substrate 104 is performed at a substantially constant depth.

Pixel 100 may comprise other elements, not shown in FIGS. 1 and 2. As an example, pixel 100 may in particular comprise a reset circuit and an anti-blooming circuit.

The sensor comprising pixel 100 is for example a sensor configured to estimate distances by time of flight (ToF). This sensor for example comprises a light source, for example, a laser, intended to illuminate a scene. The light source for example emits a periodic light signal $L_E$, for example, a sinusoidal or square signal, towards the scene. In a case where light signal $L_E$ is reflected towards the sensor by an object in the scene, a light signal $L_R$ is for example received by pixel 100. Light signal $L_R$ for example has a phase shift $\varphi$ with respect to the light signal $L_E$ emitted by the source. The estimation of phase shift $\varphi$ enables to calculate the time of flight, which may then be converted into an estimate of the distance of the object to the sensor.

To measure phase shift $\varphi$, signal $L_R$ may for example be sampled by alternately transferring, at regular intervals, the charges photogenerated in photosensitive area 102 to storage areas 110T and 110B. As an example, it is ascertained that the total duration to perform at least three successive transfers is equal to one period of signals $L_E$ and $L_R$. For this purpose, one may for example capture two successive images by using pixel 100, or simultaneously use pixel 100 and another pixel comprising two storage areas, for example, a pixel similar to pixel 100. These successive transfers are for example repeated a large number of times, for example, at least 100,000 times. The charges accumulated in storage area 110T are then for example read by transferring, to node 124T, the charges of area 110T. Similarly, the charges accumulated in storage area 110B are for example read by transferring, to node 124B, the charges of area 110B.

An advantage of pixel 100 lies in the fact that the electrically-conductive region 106C of peripheral insulating trench 106 enables to ensure an optical insulation function. More precisely, electrically-conductive region 106C enables to optically insulate the photosensitive area 102 of pixel 100 from the photosensitive areas of neighboring pixels, not shown in FIG. 1. Electrically-conductive region 106C further enables to optically insulate photosensitive area 102 from storage areas 110T and 110B. The appearing of photogenerated charges in the storage areas 110T and 110B of pixel 100, which would adversely affect the sensor operation, is thus avoided. In the case where electrically-conductive region 106C is made of a metal or of a metal alloy, pixel 100 particularly has a lower optical PLS than that of existing pixels which have polysilicon insulating trenches, by more efficiently blocking the light reaching pixel 100 under an oblique incidence.

As an example, transfer transistors 112T and 112B are designed to have dimensions smaller than the wavelength of detection by readout nodes 124T and 124B. This enables to further decrease the optical PLS of pixel 100.

Another advantage of pixel 100 lies in the fact that the biasing of transfer transistor 112T, 112B by electrode 126 enables to form, across the thickness of substrate 104, an inversion layer creating a high potential barrier all along the height of the transfer transistor. Transfer transistors 112T and 112B particularly enable to more efficiently block the photogenerated carriers than what would be for example obtained with transfer transistors formed at the surface 104T of substrate 104. A pixel 100 having an electrical PLS smaller than in the case of a pixel which would have transfer transistors formed at the surface of substrate 104 is thus obtained.

FIG. 3 is a partial simplified cross-section view of a variant of the pixel 100 of FIG. 1.

The pixel of FIG. 3 comprises elements common with the pixel 100 of FIGS. 1 and 2. These common elements will not be detailed again hereafter. The pixel of FIG. 3 differs from the pixel 100 of FIGS. 1 and 2 mainly in that, in the pixel of FIG. 3, electrically-conductive region 118 is not flush with the top surface 104T of substrate 104.

In the shown example, the top surface of region 118 is coated with an electrically-insulating layer 302. Layer 302 is for example made of a dielectric material, for example, of silicon oxide. Electrodes 126 cross electrically-conductive layer 302 to contact the top surface of region 118.

An advantage of this variant lies in the fact that the electrically-conductive regions 118 located on either side of the transfer region have a smaller surface area than in the pixel 100 of FIGS. 1 and 2. A transfer transistor having an electric capacitance smaller than that of the transfer transistor 112T of pixel 100 is thus for example obtained. This for example enables to apply to transfer transistor 112T higher switching frequencies than in the case of pixel 100.

Another advantage of the variant illustrated in FIG. 3 lies in the fact that electrically-insulating layer 302 acts as a surface passivation layer. This particularly enables to decrease the dark current.

Figure 4:
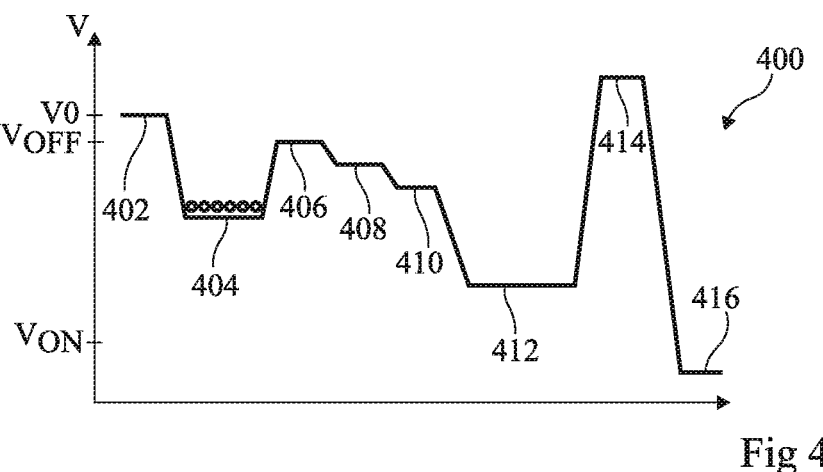
FIG. 4 is a graph illustrating a step of a pixel control method according to a first implementation mode.
Figure 5:
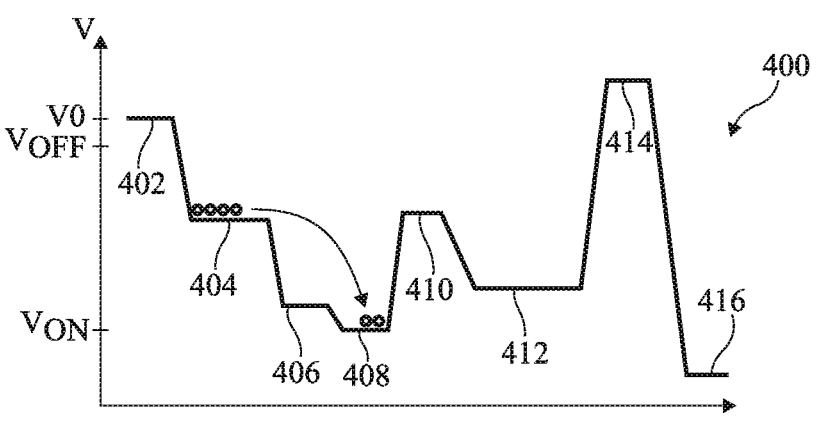
FIG. 5 is a graph illustrating another step of the pixel control method according to the first implementation mode.
Figure 6:
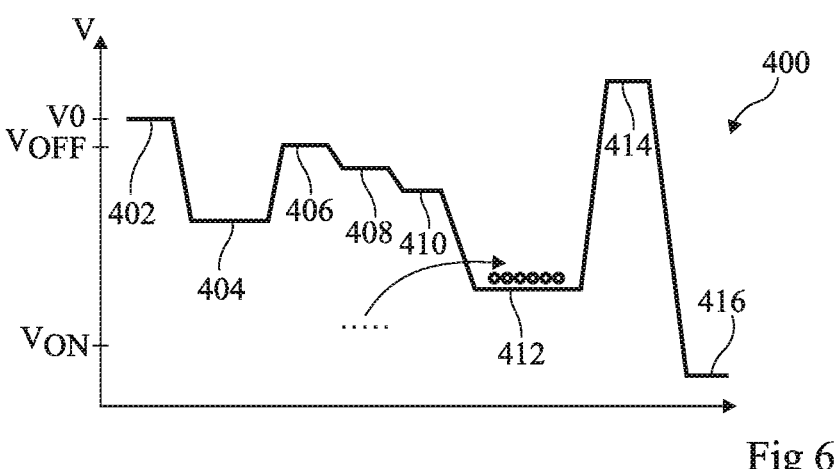
FIG. 6 is a graph illustrating still another step of the pixel control method according to the first implementation mode.

FIGS. 4 to 6 illustrate successive steps of an example of a first implementation mode of a method of controlling a pixel, for example, the pixel 100 of FIG. 1.

FIG. 4 is a graph illustrating a step of the method of controlling the pixel 100 of FIG. 1 according to the first implementation mode. The graph of FIG. 4 more particularly illustrates, with a curve 400, an example of variation of electrostatic potential V along the cross-section plane BB of FIG. 1.

Curve 400 comprises:
a portion 402 corresponding to the inversion layer formed along the walls of peripheral insulating trench 106;
a portion 404 corresponding to photosensitive area 102;
portions 406, 408, and 410 corresponding to regions of an elbow-shaped channel located between portions 114T and 116T of transfer transistor 112T, the potential difference between portions 406, 408, and 410 being obtained by adjusting doping profiles of these regions and/or the geometry of transfer transistor 112T (distance between regions 118);
a portion 412 corresponding to storage area 110T;

a portion 414 corresponding to planar transfer transistor 112T; and a portion 416 corresponding to readout node 124T.

More precisely, in the shown example:

portion 406 corresponds to an area of substrate 104 located between the end of portion 108T and the left-hand vertical portion 106L of peripheral insulating trench 106, that is, to a first portion of the elbow-shaped channel located at the input of transfer transistor 112T;

portion 408 corresponds to another area of substrate 104 located between portion 116T and the elbow located in the top left angle of trench 106, that is, to a second portion of the elbow-shaped channel; and portion 410 corresponds to still another area of substrate 104 located between the portion 116T of transfer transistor 112T and the top horizontal portion 106T of peripheral insulating trench 106, that is, to a third portion of the elbow-shaped channel located at the output of transfer transistor 112T.

FIG. 4 more particularly illustrates a step of the method of controlling pixel 100 where charges, here holes symbolized by circles, are photogenerated in photosensitive area 102. In the shown example, transfer transistor 112T is in the off state. Transfer transistor 112T for example forms a potential barrier preventing holes from being transferred from photosensitive area 102 to the storage area 110T of pixel 100.

FIG. 5 is a graph illustrating another step of the method of controlling pixel 100 according to the first implementation mode.

FIG. 5 more particularly illustrates a step of the method of controlling pixel 100 where the charges are transferred from photosensitive area 102 towards storage area 110T. In the shown example, transfer transistor 112T is in the on state. The holes are for example transferred from photosensitive area 102 to the elbow of transfer transistor 112T, symbolized by portion 408 of curve 400.

FIG. 6 is a graph illustrating still another step of the method of controlling pixel 100 according to the first implementation mode.

FIG. 6 more particularly illustrates a step of the method of controlling pixel 100 where the charges are transferred from transfer transistor 112T to storage area 110T. In the shown example, transfer transistor 112T is in the off state. The holes are then for example transferred from the elbow of transfer transistor 112T to storage area 110T.

Although this is not shown, other steps, for example of transfer from storage area 110T to readout node 124T, may then take place.

FIG. 7 is a partial simplified top view of another variant of the pixel 100 of FIG. 1.

In the variant illustrated in FIG. 7, the portion 114T of transfer transistor 112T extends horizontally, within portion 106T, from the top left angle of trench 106 to a position vertically in line with the left-hand vertical edge of the portion 116T of transfer transistor 112T. Conversely to the pixel 100 of FIG. 1, the portion 114T of the transfer transistor 112T of the pixel illustrated in FIG. 7 does not extend all the way to the position vertically in line with the right-hand vertical edge of portion 116T.

FIG. 8 is a partial simplified top view of still another variant of the pixel 100 of FIG. 1.

In the variant illustrated in FIG. 8, the portion 114T of transfer transistor 112T extends vertically, inside of portion 106L, from the top left angle of trench 106 to the level of the bottom horizontal edge of portion 108T. Conversely to the pixel 100 of FIG. 1, the portion 114T of the transfer transistor 112T of the pixel illustrated in FIG. 8 does not extend horizontally inside of portion 106T.

FIG. 9 is a partial simplified top view of still another variant of the pixel 100 of FIG. 1.

In the variant illustrated in FIG. 9, the portion 114T of transfer transistor 112T extends horizontally, inside of portion 106T, from the top left angle of trench 106 to the level of the right-hand vertical edge of portion 116T. Conversely to the pixel 100 of FIG. 1, the portion 114T of the transfer transistor 112T of the pixel illustrated in FIG. 9 does not extend vertically inside of portion 106L.

FIG. 10 is a partial simplified top view of two pixels of the type of that discussed in relation with FIG. 9.

In the shown example, the two pixels are contiguous so that they share a common vertical portion 106V of peripheral insulating trench 106. The left-hand pixel is for example symmetrical to the right-hand pixel with respect to vertical portion 106V. This enables to decrease the surface area occupied by the pixels. In the orientation of FIG. 10, referring to the pixel of FIG. 9, portion 106V corresponds to the portion 106L of the left-hand pixel and to the portion 106L to the right-hand pixel.

FIG. 11 is a partial simplified top view of two pixels of the type of that discussed in relation with FIG. 7.

In the shown example, the two pixels are contiguous so that they share a common horizontal portion 106H of peripheral insulating trench 106. This enables to decrease the surface area occupied by the pixels. In the orientation of FIG. 11, referring to the pixel of FIG. 7, portion 106H corresponds to the portion 106B of the top pixel and to the portion 106T to the bottom pixel. In the shown example, the portions 114T and 114B of the transfer transistors 112T and 112B of the pixels share a common metal region 118.

Figures 12, 13:
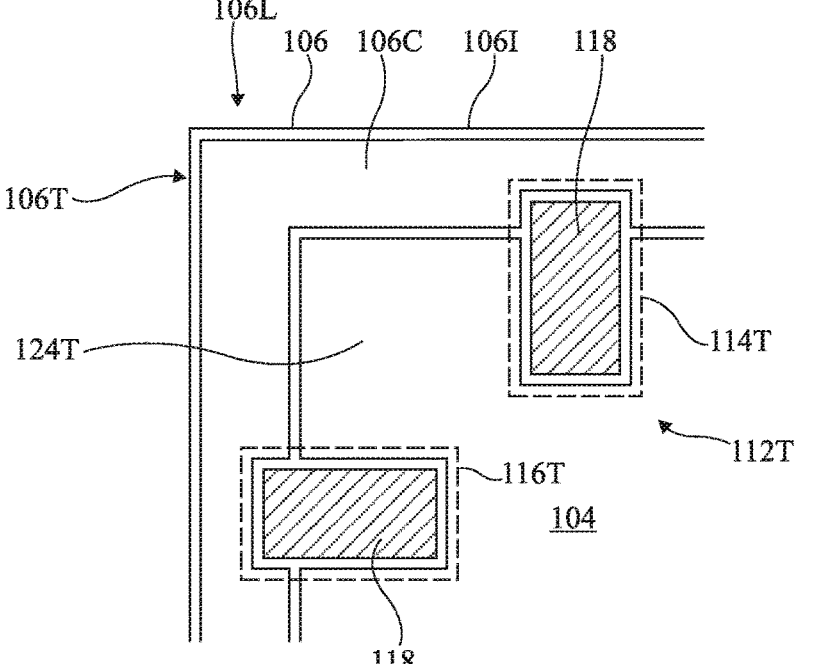
FIG. 12 is a partial simplified top view of still another variant of the pixel of FIG. 1.
FIG. 13 is a partial simplified top view of still another variant of the pixel of FIG. 1.

FIG. 12 is a partial simplified top view of still another variant of the pixel 100 of FIG. 1.

In the shown example, the portion 114T of transfer substrate 112T extends in substrate 104 from the top horizontal portion 106T of peripheral insulating trench 106. More precisely, portion 114T forms a protrusion for example penetrating into substrate 104 substantially perpendicularly to top horizontal portion 106T. In the shown example, the portion 116T of transfer substrate 112T extends in substrate 104 from the left-hand vertical portion 106L of peripheral insulating trench 106. More precisely, portion 116T forms a protrusion for example penetrating into substrate 104 substantially perpendicularly to left-hand vertical portion 106L. The portions 114T and 116T of transfer transistor 112T separate photosensitive area 102T from readout node 124T, formed in the top left corner of pixel 100 in this example.

FIG. 13 is a partial simplified top view of still another variant of the pixel 100 of FIG. 1.

In the shown example, the portions 114T and 116B of transfer substrate 112T extend in substrate 104 from the top horizontal portion 106T of peripheral insulating trench 106. More precisely, portions 114T and 116B each form a protrusion for example penetrating into substrate 104 substantially perpendicularly to top horizontal portion 106T. The portions 114T and 116T of transfer transistor 112T separate photosensitive area 102T from readout node 124T, formed in a top central portion of pixel 100 in this example.

In the examples illustrated in FIGS. 12 and 13, the photogenerated charges are directly transferred from the photosensitive area to readout node 124T by vertical transfer transistor 112T, with no intermediate storage in a memory area. In other words, as compared with the example of FIG. 1, memory area 110T (respectively 110B) and planar transfer transistor 122T (respectively 122B) are suppressed. These variants for example correspond to a case where pixel 100 implements a voltage storage. In this case, readout node 124T corresponds to a storage area of the pixel.

Although this is not shown in FIGS. 12 and 13, an additional capacitive element may for example be added on each readout node 124T to provide pixel 100 with a greater dynamic range.

Figure 14:
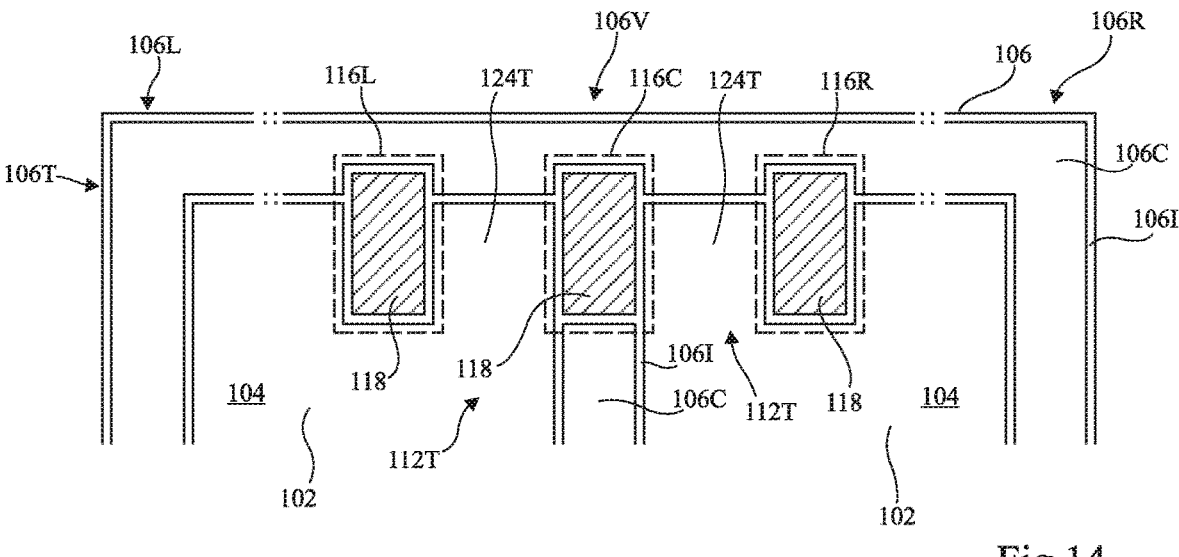
FIG. 14 is a partial simplified top view of two pixels of the type of that discussed in relation with FIG. 13.

FIG. 14 is a partial simplified top view of two pixels of the type of that discussed in relation with FIG. 13.

In the shown example, the two pixels are contiguous, similarly to what has been previously discussed in relation with FIG. 10, that is, so that they share the common vertical portion 106V of peripheral insulating trench 106. In the orientation of FIG. 14, referring to the pixel of FIG. 13, portion 106V corresponds to the portion 106R of the left-hand pixel and to the portion 106L of the right-hand pixel.

In the shown example, the transfer transistors 112T of the two pixels have a common portion 114C. Portion 114C is formed in the vertical portion 106V of peripheral insulating trench 106. In this example, the pixels share a common gate 118. On either side of portion 114C are formed portions 116L and 116R of transfer transistors 112T, similar to the portion 116T previously described in relation with FIG. 13. Portions 114C, 116L, and 116R are for example parallel to one another. In this case, the transfer transistors 112T of the two adjacent pixels are for example driven synchronously.

In the orientation of FIG. 14, the readout node 124T of the left-hand pixel is separated from photosensitive area 102 by a channel delimited by the portions 116L and 114C of its transfer transistor 112T. Similarly, the readout node 124T of the right-hand pixel is separated from photosensitive area 102 by another channel delimited by the portions 114C and 116R of its transfer transistor 112T.

The portion 114C common to the two adjacent pixels particularly enables to provide a larger photosensitive area 102 than in a case, for example, where the pixels would be contiguous with no common portion 114C. The sensitivity of the sensor is thus increased.

Figure 15:
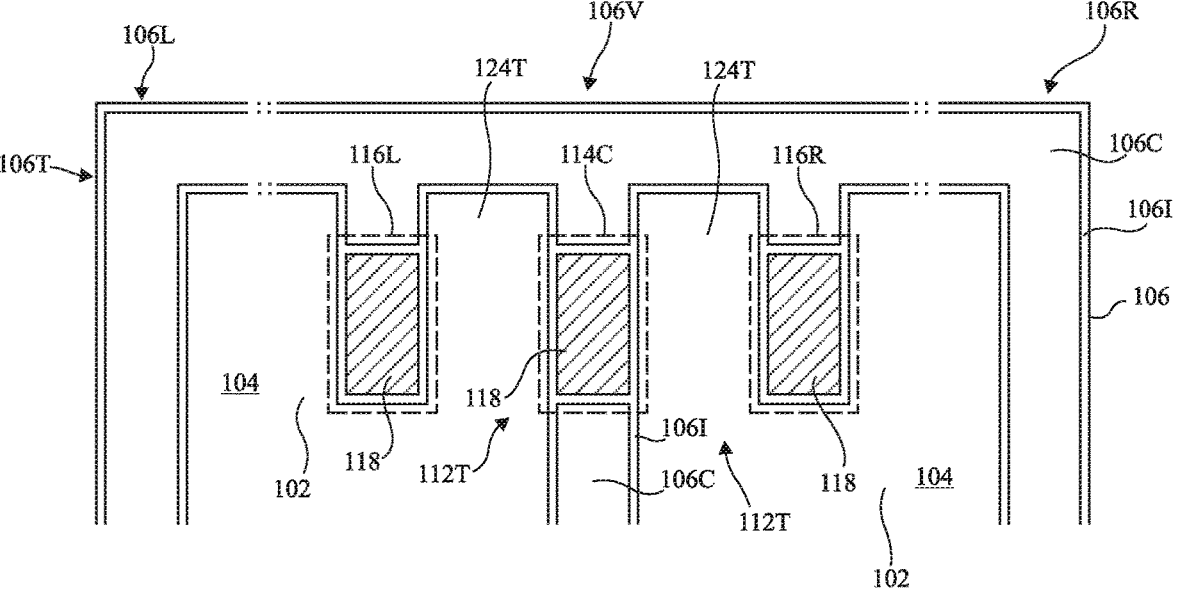
FIG. 15 is a partial simplified top view of a variant of the two pixels of FIG. 14.

FIG. 15 is a partial simplified top view of a variant of the two pixels of FIG. 14.

As compared with the pixels of FIG. 15, the portions 116L and 116R of the transfer transistors 112T of the two pixels penetrate further into substrate 104 towards the center of photosensitive area 102. This allows a more efficient blocking of the carriers between photosensitive area 102 and readout nodes 124T.

The pixels discussed hereabove in relation with FIGS. 12 to 15 for example form part of a global shutter sensor or of a time-of-flight distance sensor.

Figures 16, 17, 18:
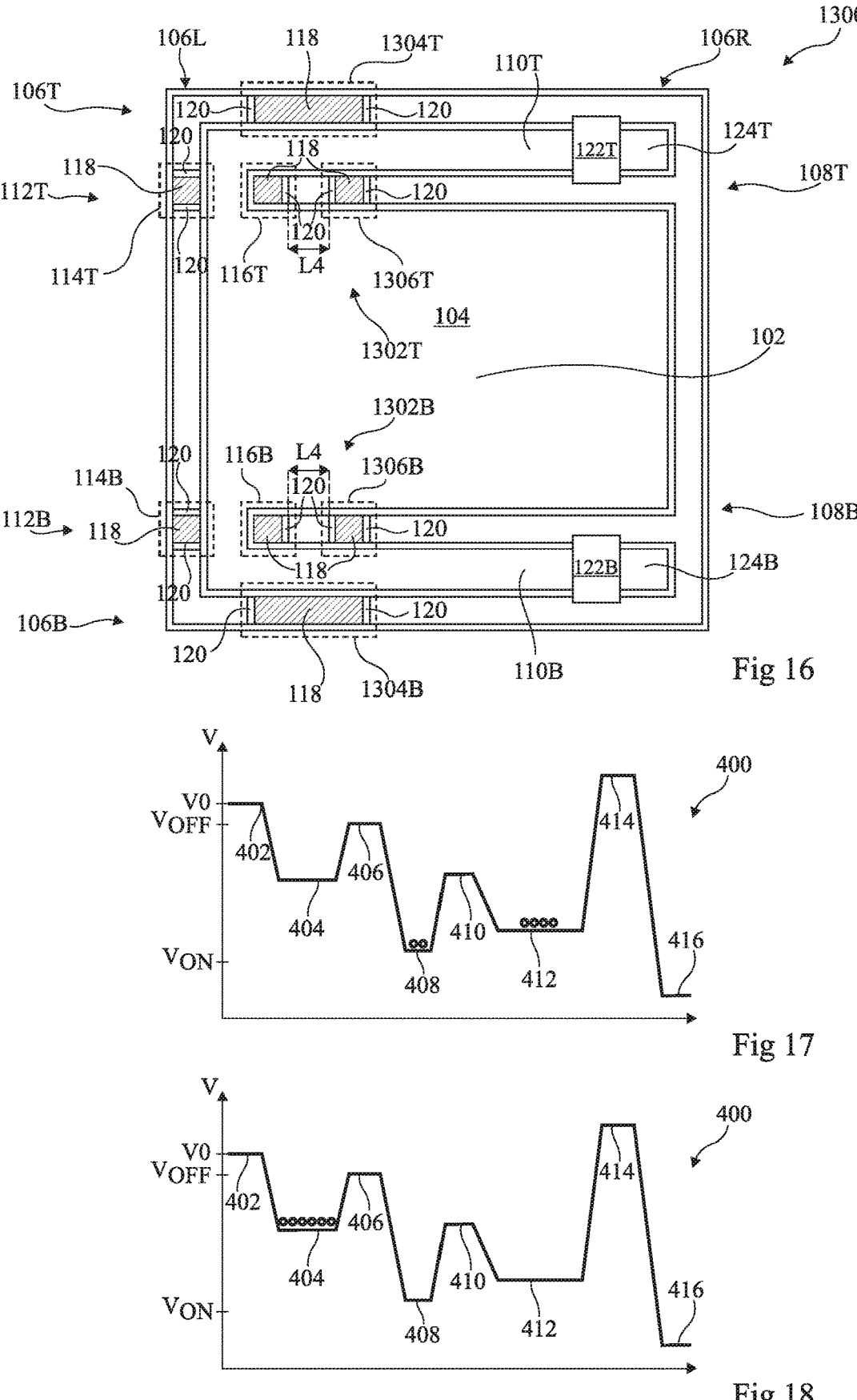
FIG. 16 is a partial simplified top view of a pixel of an image sensor according to a second embodiment.
FIG. 17 is a graph illustrating a step of a pixel control method according to a second implementation mode.
FIG. 18 is a graph illustrating a step of a pixel control method according to a third implementation mode.

FIG. 16 is partial simplified top view of an example of a pixel 1300 of an image sensor according to a second embodiment. The pixel 1300 of FIG. 16 comprises elements common with the pixel 100 of FIG. 1. These common elements are not detailed again hereafter. The pixel 1300 of FIG. 16 differs from the pixel 100 of FIG. 1 mainly in that pixel 1300 comprises, in addition to the first transfer transistors 112T and 112B, third transfer transistors (that may also be called third transfer gates) 1302T and 1302B. Transfer transistors 1302T and 1302B are vertical transistors similar to the previously-described transistors 112T, respectively 112B.

The third transfer transistors 1302T and 1302B of pixel 1300 particularly enable to improve the control of charge transfers from photosensitive area 102 to storage areas 110T and 110B. Transfer transistor 1302T comprises a portion 1304T, formed in the top horizontal portion 106T of peripheral insulating trench 106, and another portion 1306T, formed in portion 108T. Similarly, transfer transistor 1302B comprises a portion 1304B, formed in the bottom horizontal portion 106B of peripheral insulating trench 106, and another portion 1306B, formed in portion 108B.

In the orientation of FIG. 16, the portion 1304T of transfer transistor 1302T extends horizontally, inside of portion 106T, from the position vertically in line with the left-hand vertical edge of the portion 116T of the first transfer transistor 112T to the position vertically in line with the right-hand vertical edge of the portion 1306T of the third transfer transistor 1302T. Similarly, the portion 1304B of transfer transistor 1302B extends horizontally, inside of portion 106B, from the position vertically in line with the left-hand vertical edge of the portion 116B of the first transfer transistor 112B to the position vertically in line with the right-hand vertical edge of the portion 1306B of the third transfer transistor 1302B.

Further, in the shown example, the portion 114T of transfer transistor 112T extends vertically, inside of portion 106L, from the level of the top horizontal edge of portion 108T to the level of the bottom horizontal edge of portion 108T. Similarly, the portion 114B of transfer transistor 112B extends vertically, inside of portion 106L, from the level of the top horizontal edge of portion 108B to the level of the bottom horizontal edge of portion 108B.

In the shown example, the portion 116T of the first transfer transistor 112T is separated from the portion 1306T of the third transfer transistor 1302T by a distance L4. As an example, distance L4 is in the range from 50 nm to 300 nm. The portion 116B of the first transfer transistor 112B is for example separated from the portion 1306B of the third transfer transistor 1302B by distance L4.

In the shown example, the first transfer transistors 112T, 12B have a smaller surface area than the third transfer transistors 1302T, 1302B. This for example enables to switch the first transfer transistors 112T, 112B between the on state and the off state at a switching frequency greater than that of the third transfer transistors 1302T, 1302B.

FIG. 17 is a graph illustrating a step of a method of controlling a pixel, for example, the pixel 1300 of FIG. 16, according to a second implementation mode.

In the shown example:

portions 402, 404, 412, 414, 416 are unchanged as compared with what has been previously discussed in relation with FIGS. 4 to 6;

portion 406 corresponds to a region of substrate 104 located between the vertical gates 118 of the first transfer transistor 112T;

portion 408 correspond to a region of substrate 104 located between the vertical gates 118 of the third transfer transistor 1302T; and portion 410 corresponds to a region of substrate 104 located between the third transfer transistor 1302T and storage area 110T.

During the first steps of this method, the first transfer transistor 112T and the third transfer transistor 1302T are set to the on state. The third transistor 1302T is for example assumed to be on at the time of the setting to the on state of the first transfer transistor 112T. As an example, the first and third transfer transistors 112T, 1302T are simultaneously set to the on state. A potential curve similar to that of FIG. 5 is then obtained. The method then carries on with the step illustrated in FIG. 17.

FIG. 17 more particularly illustrates a step of the method of controlling pixel 1300 where the charges are transferred from the first transfer transistor 112T to the third transfer transistor 1302T. During this step, the first transfer transistor 112T is in the off state and the third transfer transistor 1302T is maintained in the on state.

After this step, transfer transistor 1302T is controlled to the off state (transistor 112T being maintained off). The photogenerated charges are thus transferred into storage area 110T. A potential curve similar to that of FIG. 6 is thus obtained.

The second implementation mode corresponds to a case where:

the first transfer transistor 112T and the third transfer transistor 1302T are driven synchronously;

the first transfer transistor 112B and the third transfer transistor 1302B are driven synchronously; and transfer transistors 112T and 1302T may be driven asynchronously with respect to transfer transistors 112B and 1302B.

In this implementation mode, the first transfer transistors 112T, 112B and the third transfer transistors 1302T, 1302B are set to the on state, for example, simultaneously, during a same step.

FIG. 18 is a graph illustrating a step of a method of controlling a pixel, for example, the pixel 1300 of FIG. 16, according to a third implementation mode.

The first step of this method is for example similar to that previously described in relation with FIG. 4. During this first step, the first transfer transistor 112T and the third transfer transistor 1302T are maintained in the off state.

FIG. 18 more particularly illustrates another step of the method of controlling pixel 1300, where the third transfer transistor 1302T is in the on state (resulting in lowering the potential of region 408) while the first transfer transistor 112T is maintained in the off state. In the shown example, the photogenerated charges are contained in photosensitive area 102.

After this step, the transfer transistor 112T is controlled to the on state (transistor 1302T being maintained on). A potential curve similar to that of FIG. 5 is then obtained. Then, the method carries on identically or similarly to what has been described hereabove in relation with FIG. 17.

The third implementation mode corresponds to a case where the first transfer transistors 112T, 112B and the third transfer transistors 1302T, 1302B are driven asynchronously. In this implementation mode, the setting to the on state and the setting to the off state of the third transfer transistors 1302T, 1302B are for example offset with respect to the setting to the on state and the setting to the off state of the first transistors 112T, 112B.

An advantage of the third implementation mode lies in the fact that it enables to transfer charges from photosensitive area 102 to one of storage areas 110T, 110B while the transfer to the other storage area 110B, 110T is not over yet.

Figures 19, 20, 21, 22, 23:
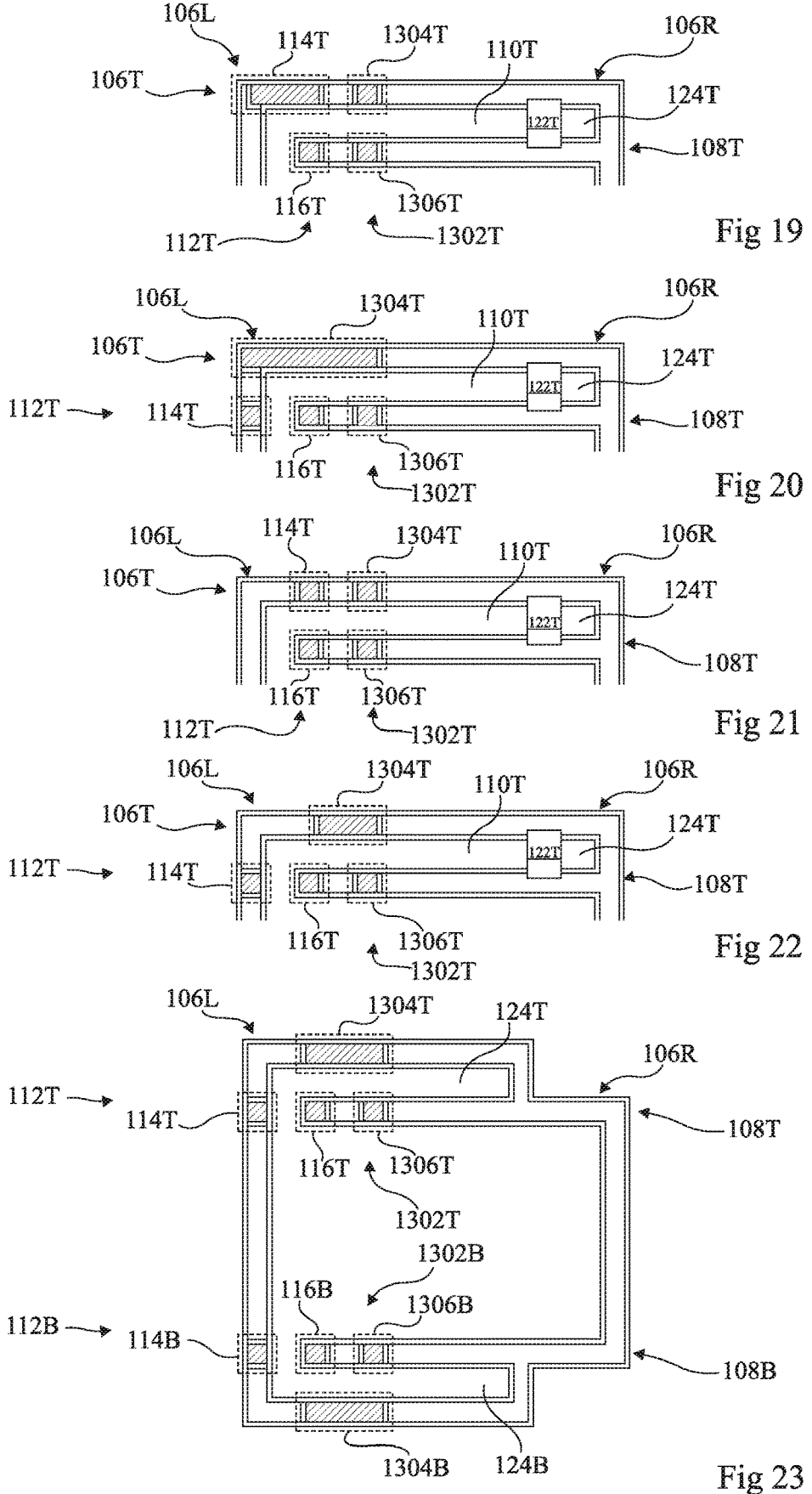
FIG. 19 is a partial simplified top view of a variant of the pixel of FIG. 16.
FIG. 20 is a partial simplified top view of another variant of the pixel of FIG. 16.
FIG. 21 is a partial simplified top view of still another variant of the pixel of FIG. 16.
FIG. 22 is a partial simplified top view of still another variant of the pixel of FIG. 16.
FIG. 23 is a partial simplified top view of still another variant of the pixel of FIG. 16.

FIG. 19 is partial simplified top view of a variant of the pixel 1300 of FIG. 16.

In the variant illustrated in FIG. 19, the portion 114T of transfer transistor 112T extends horizontally, inside of portion 106T, from the top left angle of trench 106 to the position vertically in line with the right-hand vertical edge of portion 116T. In the shown example, the portion 1304T of transfer transistor 1302T extends horizontally, inside of portion 106T, from the position vertically in line with the left-hand vertical edge of portion 1306T to the position vertically in line with the right-hand vertical edge of portion 1306T.

FIG. 20 is a partial simplified top view of another variant of the pixel 1300 of FIG. 16.

In the variant illustrated in FIG. 20, the portion 114T of transfer transistor 112T extends vertically, inside of portion 106L, from the level of the top horizontal edge of portion 108T to the level of the bottom horizontal edge of portion 108T. In the shown example, the portion 1304T of transfer transistor 1302T extends horizontally, inside of portion 106T, from the top left angle of peripheral insulating trench 106 to the position vertically in line with the right-hand vertical edge of portion 1306T.

FIG. 21 is a partial simplified top view of still another variant of the pixel 1300 of FIG. 16.

In the variant illustrated in FIG. 21, the portion 114T of transfer transistor 112T extends horizontally, inside of portion 106T, from the position vertically in line with the left-hand vertical edge of portion 116T to the level of the right-hand vertical edge of portion 116T. In the shown example, the portion 1304T of transfer transistor 1302T extends horizontally, inside of portion 106T, from the position vertically in line with the left-hand vertical edge of portion 1306T to the position vertically in line with the right-hand vertical edge of portion 1306T.

FIG. 22 is a partial simplified top view of still another variant of the pixel 1300 of FIG. 16.

In the variant illustrated in FIG. 21, the portion 114T of transfer transistor 112T extends vertically, inside of portion 106L, from the level of the top horizontal edge of portion 108T to the level of the bottom horizontal edge of portion 108T. In the shown example, the portion 1304T of transfer transistor 1302T extends horizontally, inside of portion 106T, from the position vertically in line with the right-hand vertical edge of portion 116T to the position vertically in line with the right-hand vertical edge of portion 1306T.

FIG. 23 is a partial simplified top view of still another variant of the pixel 1300 of FIG. 16. The variant illustrated in FIG. 23 for example corresponds to a case similar to the variants discussed in relation with FIG. 12, where pixel 1300 implements a voltage storage.

In the shown example, the portions 106T and 106B of peripheral insulating trench 106 do not horizontally extend to intersect portion 106R. Portions 106T and 106*b* are respectively connected to portions 108T and 108B by vertical portions 2000T and 2000B. Portions 2000T and 2000B are for example perpendicular to portions 108T and 108B. In this example, memory areas 110T and 110B and planar transfer transistors 122T and 122B are omitted.

Various embodiments, implementation modes, and variants have been described. Those skilled in the art will understand that certain features of these various embodiments, implementation modes, and variants, may be combined and other variants will occur to those skilled in the art. In particular, the variants discussed in relation with FIGS. 10 and 11 may be combined. Further, the variants of pixel 100 discussed in relation with FIGS. 7 to 11 may be adapted to the embodiment of the pixel 1300 of FIG. 16 and to the variants described in relation with FIGS. 19 to 23.

Although examples of application to a time-of-flight distance measurement sensor have been described hereabove, the discussed embodiments and implementation modes may be transposed by those skilled in the art to other types of sensors, for example, sensors comprising a single storage area 110T or 124T, for example, global shutter sensors. Further, it will be within the abilities of those skilled in the art to adapt the above embodiments and implementation modes to conductivity types opposite to those described.

Finally, the practical implementation of the described embodiments, implementation modes, and variants is within the abilities of those skilled in the art based on the functional indications given hereabove. In particular, it will be within the abilities of those skilled in the art to adapt the number, the position, and the surface area of the vertical transfer transistors according to the targeted application.

The invention claimed is:

1. Image sensor comprising a plurality of pixels formed inside and on top of a semiconductor substrate, each pixel comprising:

a photosensitive area formed in the semiconductor substrate;

a storage area formed in the semiconductor substrate; and a first transistor of transfer between the photosensitive area and the storage area, wherein the first transfer transistor comprises a gate vertically extending in the semiconductor substrate, from a top surface of the semiconductor substrate, inside of a capacitive insulating trench, comprising an electrically-conductive region electrically insulated from the semiconductor substrate, delimiting the storage area, the gate of the first transfer transistor of each pixel being electrically insulated from the semiconductor substrate and from the conductive region;

wherein the capacitive insulating trench comprises, in top view, top and bottom horizontal portions, left-hand and right-hand vertical portions and an intermediate horizontal portion interposed between the top and bottom horizontal portions and extending from the right-hand vertical portion towards the left-hand vertical portion, the first transistor of transfer comprising a portion formed at an angle of the capacitive insulating trench where the left-hand vertical portion and the top horizontal portion intersect, and another portion formed at an end of the intermediate horizontal portion located opposite the left-hand vertical portion;

wherein the intermediate horizontal portion is parallel to the top horizontal portion and separated from the top horizontal portion by a distance in the range from 50 nm to 400 nm.

2. Sensor according to claim 1, wherein:

the conductive region is intended to be taken to a fixed potential; and the gate is intended to be taken to a variable potential, having a first level controlling the setting to the on state of the first transfer transistor and a second level controlling the setting to the off state of the first transfer transistor.

3. Sensor according to claim 1, wherein the gate is made of a metal or of a metal alloy.

4. Sensor according to claim 1, wherein the gate is made of polysilicon.

5. Sensor according to claim 1, configured to estimate distances by time of flight.

6. Sensor according to claim 1, wherein the storage area is separated from the first transfer transistor by a second transfer transistor.

7. Sensor according to claim 6, wherein the second transfer transistor comprises a gate vertically extending in the semiconductor substrate, from the top surface of the semiconductor substrate, inside an insulating trench delimiting the storage area.

8. Method of controlling a sensor according to claim 6 comprising, for each pixel, the steps of:

a) setting the second transfer transistor to the on state;

b) setting the first transfer transistor to the on state;

c) after steps a) and b), setting the first transfer transistor to the off state; and d) after step c), setting the second transfer transistor to the off state.

9. Method according to claim 8, wherein steps a), and b) are carried out simultaneously.

* * * * *